United States Patent [19]
Laube

[11] Patent Number: 5,651,797
[45] Date of Patent: Jul. 29, 1997

[54] APPARATUS AND METHOD FOR THE IMMERSION CLEANING AND TRANSPORT OF SEMICONDUCTOR COMPONENTS

[75] Inventor: David P. Laube, Mesa, Ariz.

[73] Assignee: Joray Corporation, Phoenix, Ariz.

[21] Appl. No.: 511,975

[22] Filed: Aug. 7, 1995

[51] Int. Cl.⁶ ..................... H01L 21/304; H01L 21/306; B01L 1/00
[52] U.S. Cl. .................. 29/25.01; 437/210; 414/935; 454/187; 134/32; 134/83; 134/133; 134/165
[58] Field of Search .................. 29/25.01; 437/210; 414/935; 454/187; 134/32, 83, 133, 165

[56] References Cited

U.S. PATENT DOCUMENTS 4,855,023  8/1989  Clark et al. .................. 204/130
5,269,643  12/1993  Kodama et al. .................. 414/416
5,429,642  7/1995  Ohkuma .................. 29/25.01

FOREIGN PATENT DOCUMENTS 63-248449  10/1988  Japan.
2-277556  11/1990  Japan.

*Primary Examiner*—David E. Graybill
*Attorney, Agent, or Firm*—Joseph H. Roediger

[57] ABSTRACT

An ultrasonic immersion cleaning tank is constructed to serve as a pass-through between a processing environment and a clean room. The tank is sited as the entryway into a bounded clean room. Particle barriers and positive pressure are utilized to reduce entry of contaminants into the clean room. The components after cleaning are withdrawn from the tank directly into the clean room environment thereby greatly reducing surface contamination thereof.

18 Claims, 3 Drawing Sheets

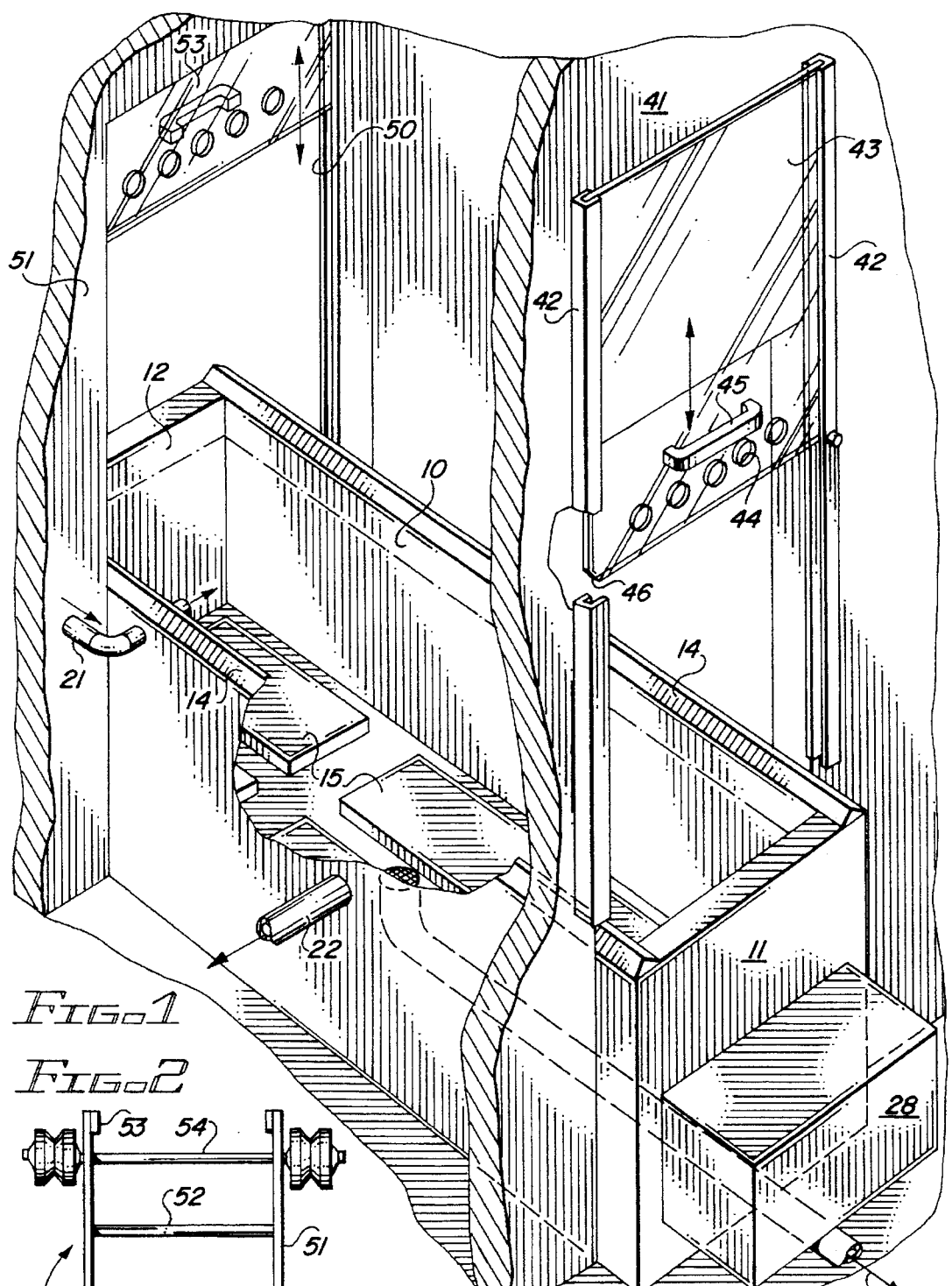
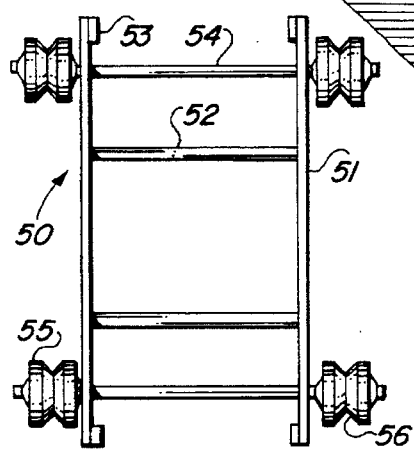
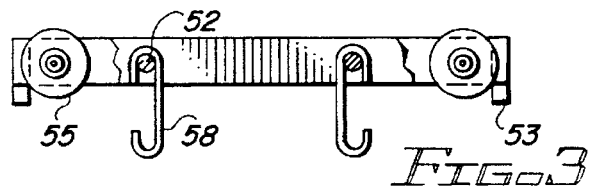
FIG.1
FIG.2
FIG.3

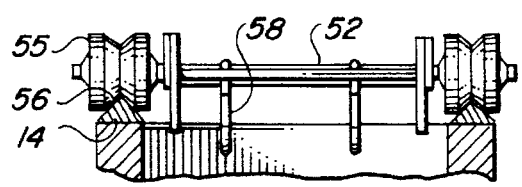
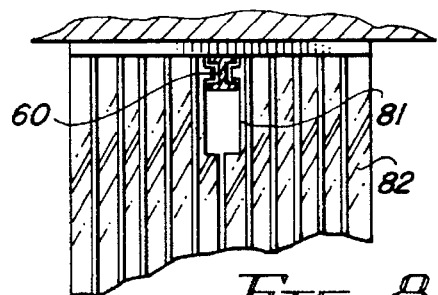
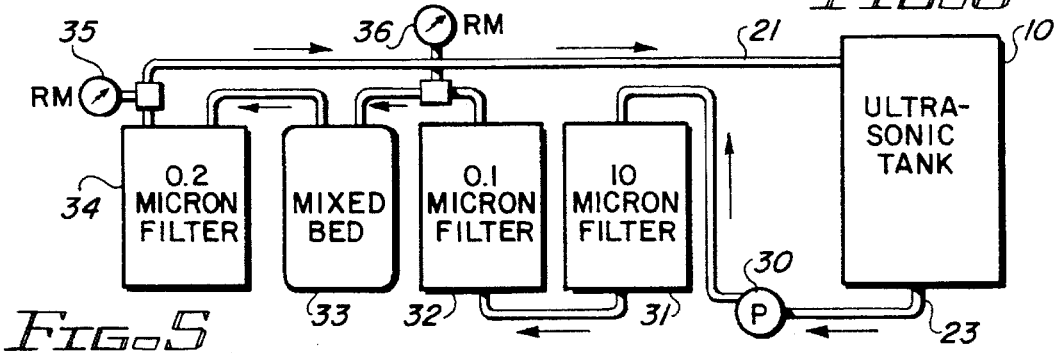
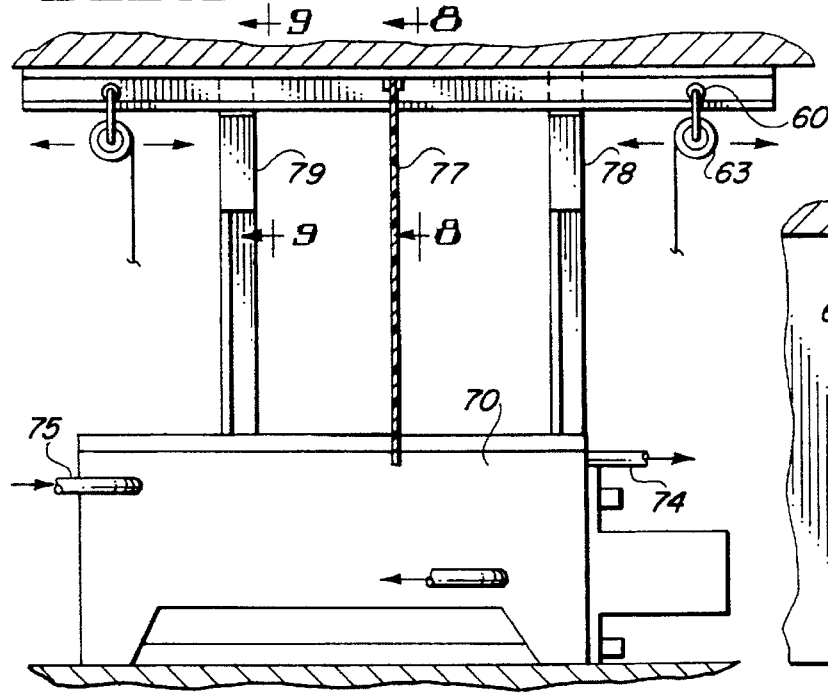
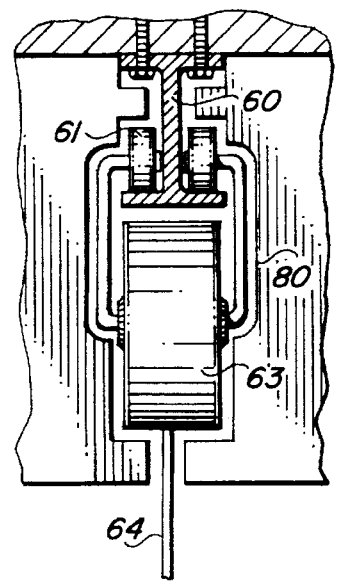
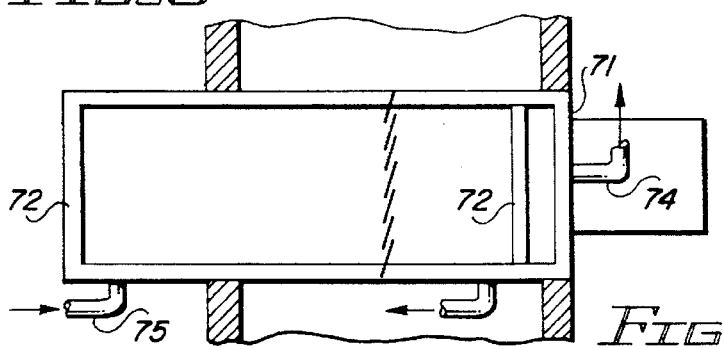

APPARATUS AND METHOD FOR THE IMMERSION CLEANING AND TRANSPORT OF SEMICONDUCTOR COMPONENTS

BACKGROUND OF THE INVENTION

This invention relates to apparatus for cleaning semiconductor processing equipment and transporting same to a clean room environment and the method of conducting the cleaning and transport thereof.

In the manufacture of semiconductor components such as integrated circuits, the processing of the semiconductor substrate utilizes a number of deposition steps. Deposition of metallic materials occurs in a variety of environments and under different conditions. Common to virtually all deposition techniques is the buildup of deposited material on the processing equipment itself. Since the manufacturing yield depends on the deposition of material in certain carefully prescribed locations, the introduction of material in an unpredictable manner due to flaking and spalling from deposited material on the equipment itself is to be avoided. Consequently, the equipment is periodically disassembled into components and subjected to elaborate cleaning rituals. The cleaning process typically utilizes a number of steps designed to etch away deposited material. The cleaning process is carried out at a location other than the manufacturing environment.

The manner of transport of the equipment components to the cleaning process area is not particularly significant since the components will be acid-bathed, surfaced textured, and carefully washed under controlled conditions. The final washing and drying in an inert atmosphere are undertaken to provide a component having a surface free of contamination. The component is then packaged and sealed for return to the manufacturing environment.

Since the initial cleaning steps are concerned with the removal of deposited masses of material these steps are not well-suited to being performed in a clean room environment. The particles generated prevent maintaining the strict standards of atmospheric cleanliness associated with clean rooms having a low particle count per unit volume. However, the final preparation steps and packaging are carried out in a clean room environment, typically a class 100 room, wherein the quantity of airborne particles per unit volume is strictly controlled. The objective of the process is to return the equipment components to the manufacturing environment with a cleanliness factor that meets an objective standard so as not to reduce the manufacturing yield when returned to service.

Heretofore, it is customary to complete the physical removal of depositing materials in a processing environment and then place the equipment components in a water-filled wheeled carrier. The wheeled carrier serves as a holding tank as it is moved into the final packaging area. The transport of the carrier into the clean room has the capability of introducing contaminants into the final clean room. In this room, the equipment components are physically removed from the holding tank and wiped down with a lint-free cloth while exposed to the atmosphere. The wipe-down frequently adds particles to the component surface as well as leaving minute pieces of threads on the surface. Next, the components are dried in an oven having a nitrogen environment. Particles on the component surface after wipe-down tend to remain in place thereby degrading the effectiveness of the cleaning process.

The present invention is directed to apparatus which enables the equipment components to be introduced into the final clean room environment for final drying and packaging without introducing contaminants from the cleaning process environment. In addition, the apparatus provides immersion cleaning during transport to remove particles adhering to the surface which had their origin in the initial stages of cleaning. As a result, the delivery or transport vehicle with the contained liquid therein is eliminated and therefore does not introduce contaminants into the final clean room from the processing environment.

The present invention also comprises a method of immersion cleaning of the components during transport while submerged in liquid. The cleaning step takes place during the introduction of the component into the clean room. The cleaning liquid is shielded from the processing environment by a particle barrier to substantially reduce the opportunity for airborne particles to enter the liquid. A positive pressure gradient from the final clean room to the processing environment aids in reducing the opportunity for particles to enter the liquid.

Accordingly, the present invention is directed to the provision of apparatus for transporting equipment components from a processing environment that is characterized by a high particle containing atmosphere to a clean room having a controlled environment. The invention includes the method of effecting the transport of components while conducting immersion cleaning to further remove surface adhering particles from the components.

SUMMARY OF THE INVENTION

This invention relates to apparatus for the immersion cleaning of disassembled equipment components from semiconductor manufacturing equipment and the transport of the components from the processing environment to a bounded clean room and the method of performing same.

The transport apparatus includes a tank having first and second ends with a longitudinal axis extending therebetween. The tank contains the cleaning liquid, typically deionized water, and a transducer for generating ultrasonic waves in the cleaning liquid. The equipment components are supported in the cleaning liquid by hooks depending from a movable component support. The support overlies the tank and is movable along the longitudinal axis thereby transporting the components through the liquid from one end of the tank to the other.

The invention includes a first particle barrier located at the first end of the tank to shield the liquid therein from airborne particles generated in the cleaning process area. The barrier contains a port in which a movable panel is mounted to permit the component being cleaned to be attached to a hook on the movable support. After attachment, the support is started on its movement toward the second end and the panel is returned to the closed position. The component is likely to contain surface particles which are removed in the bath. The support is moved toward the second end of the tank during the immersion cleaning.

A second particle barrier having a port with a movable panel therein is located proximate to the second end of the tank. After transport along the longitudinal axis of the tank, the component is withdrawn in the clean room. The second particle barrier bounds the clean room so that the withdrawn component is not exposed to the airborne contaminant level of the processing environment. Furthermore, the immersion cleaning during transport has dislodged surface adhering particles present when the component is attached to the movable support.

In the preferred embodiment, the apparatus includes a circulation pump coupled between the first and second ends of the tank for introducing liquid at the end proximate to the clean room. In addition, surface skimming of the liquid in the tank is provided away from the end proximate to the clean room. In many applications of the invention, the tank extends beyond the second particle barrier into the clean room. As a result, the components are withdrawn from the cleaning liquid in the clean room atmosphere. The surface wiping of components to remove adhered particles heretofore practiced can be eliminated.

Further features and advantages of the present invention will become more readily apparent from the following detailed description of preferred embodiments of the invention when taken in conjunction with the accompanying drawings.

BRIEF DESCRIPTION OF THE DRAWINGS

FIG. 1 is a view in perspective of one embodiment of the invention.

FIG. 2 is a top view of the movable component support used in the embodiment of FIG. 1.

FIG. 3 is a side view of the support of FIG. 2.

FIG. 4 is an end view of the support of FIG. 2.

FIG. 5 is a diagram showing the liquid circulation system used in the embodiment of FIG. 1.

FIG. 6 is an end view in partial section of a second embodiment of the invention.

FIG. 7 is a top view of the tank used in the embodiment of FIG. 6.

FIG. 8 is a partial cross section taken along line 8—8 of FIG. 6.

FIG. 9 is a partial cross section taken along line 9—9 of FIG. 6.

DESCRIPTION OF THE PREFERRED EMBODIMENT

Figure 10:
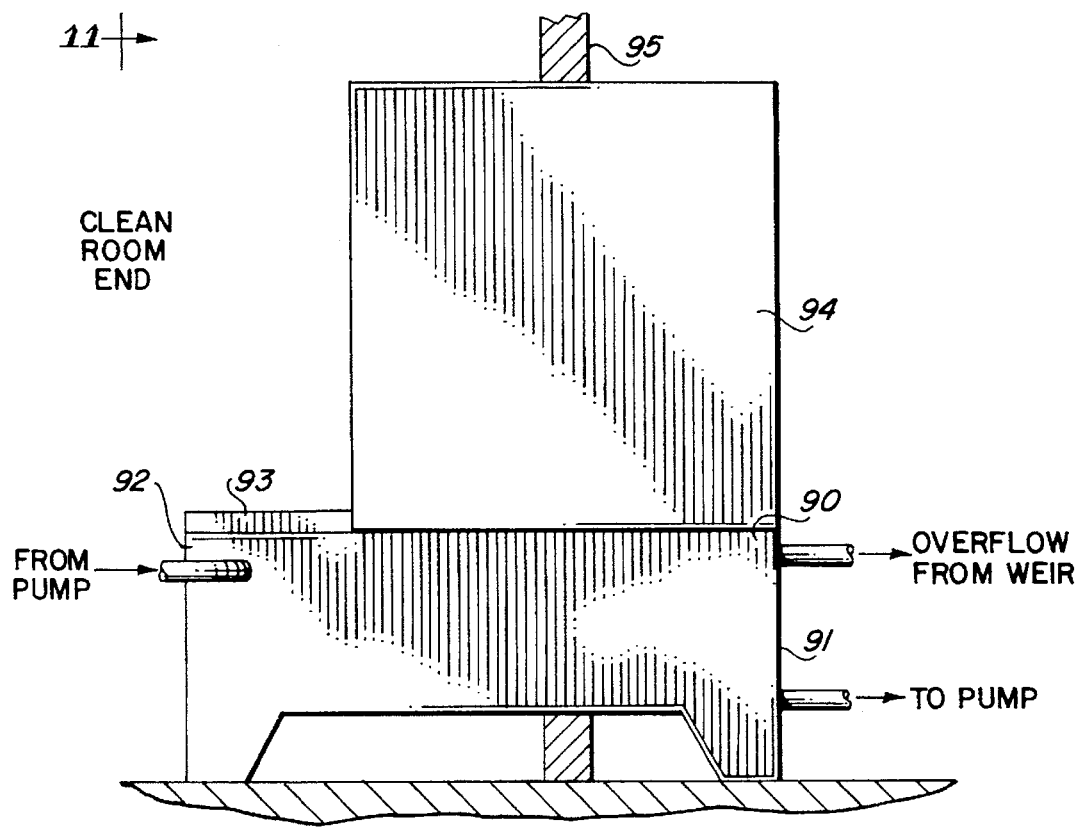
FIG. 10 is a side view of a third embodiment of the invention.

Referring now to the embodiment of FIG. 1, the invention is shown comprising an elongated tank 10, preferably formed of stainless steel, having first and second ends 11 and 12 respectively. The tank is provided with guideways 14 extending parallel to the longitudinal axis of the tank and located on the sides thereof. The guideways receive the rollers of a movable component support which transports attached components through the tank.

Tank 10 includes a plurality of spaced transducers 15 on the bottom surface. The transducers are six in number and cover substantially the entire bottom surface of the tank. In one embodiment, the transducers employed are "Model CB 1224-40-24" manufactured by the Branson Company. The transducers are energized at 40 Hz with power levels in the range of 4 to 6 watts per square inch. The tank is filled with deionized water. The transducers are energized during the time taken for the components in the tank to be transported can cleaned. Typically, the time taken to travel the 7 foot length of the tank is about 4 minutes. The electrical power source for the transducers is located in housing 28 and is a commercially-available unit so that further discussion thereof is omitted.

The tank 11 in FIG. 1 is shown with three fluid couplings 21, 22 and 23 with the fluid introduction taking place through coupling 21 proximate to second end 12 of the tank. The coupling 23 withdraws fluid from bottom opening 25 in the tank and is coupled to a pump 30 seen in FIG. 5. The coupling 22 is located near the top of the side of the tank and provides a skimming function for the surface of the water in the tank. Coupling 22 can be coupled to a secondary catchment for storing the topmost water in the tank which is likely to have a high particle count for reasons that will later be explained.

The first end 11 of tank 10 is mounted in a particle barrier formed by the combination of wall 41 and vertical guides 42. The guides 42 define a port in the particle barrier into which panel 43 is mounted for vertical movement. The panel 43 is provided with openings 44 which permit the passage of air therethrough caused by a pressure differential between opposing ends of the tank. When panel 43 is at its lowermost position, the chamfer 46 at the bottom edge of the panel rests against the inside edge of the guideway 14. An opening between the outer edge of the guideway 14 and the vertical guide 42 remains to add in the flow of air across the tank. The openings 44 are included in the preferred embodiment to aid in the air flow.

The second end 12 of tank 11 is provided with a like arrangement of wall 51 and vertical guides 52 forming a particle barrier for the clean room. A similar vertically moveable panel 53 is located in the port of the particle barrier at the second end. When the panel 53 is down, the airflow across the tank occurs primarily through the openings in the panels. The second end of the tank extends beyond the boundary of the clean room into the room in the embodiment of FIG. 1 to permit removal of components from the tank within the relatively clean atmosphere of the final clean room. It is to be noted that the first end 11 of tank 10 does not extend into the processing environment thereby preventing continual contact between the relatively contaminated atmosphere in the processing room and the liquid in the tank.

The typical clean room whether classified with a 10,000 or a 100 particle per cubic foot rating has a positive pressure to reduce the likelihood of external air carrying particles from entering the clean room. The present invention utilizes the pressure differential in favor of the final clean room by providing openings in the panels near the surface of the liquid in the tank to convey air from this clean room across the surface of the liquid and through the openings in the panel at the first end. When the panel 43 is raised to place components to be cleaned in the tank, the positive pressure established by the clean room retards the flow of air from the processing environment in the region above the tank. Thus, the likelihood of airborne particles contacting the liquid is substantially eliminated.

The equipment components which are to be transported into the clean room by means of the present invention are suspended in the liquid in the tank from a movable component support 50 shown in FIGS. 2, 3 and 4. The support includes opposing sides 51 with a pair of cross braces 52 therebetween to form a rectangular structure. Axles 54 are provided with wheels 55. Each wheel contains a peripheral notch 56 that receives a guideway 14 therein when the structure is in position for movement along the top of the tank.

Depending hooks 58 are located on the cross braces 52 as shown in FIG. 3. The components to be cleaned are placed on the hooks when the support 50 is positioned on the guideways at the first end of the tank and the panel 43 is raised to provide access to the tank. In the cleaning of components of semiconductor processing equipment, the size of the components varies from paper-clip size to 40 lb.

parts. As mentioned, the parts have been subjected to various etching procedures and surface texturing steps with the result that the parts are likely to contain residual particles on the surface. Also, the surrounding atmosphere contains particles in account above the limit for final packaging in the final clean room. As seen in FIG. 4, the hooks 58 extend below the level of liquid in the tank enabling the component to be completely immersed in the liquid.

The initial placement of the components in the liquid at the first end 11 of the tank followed by the activation of the transducers in the bottom of the tank causes particles to be removed more heavily near this first end. The movement of the structure to the second end is accomplished by use of a push rod, or manually if the tank length is relatively short. While the dislodging of particles takes place during movement of the components through the tank, the major particle removal occurs in the first half of the tank. The circulation pattern of the liquid in the embodiment of FIG. 1 draws the liquid from the bottom of the tank at the center thereof and subjects it to a cleaning cycle as shown in FIG. 5 before reintroducing it via coupling 21 near second end 12 of the tank. The liquid is drawn from the tank by suction pump 30 and passed through filters 31 and 32 to remove particles larger than 0.1 micron. A resistivity meter 36 is used to determine the presence of ionized impurities. Next, the liquid is passed through a mixed bed ion exchanger 33 to remove anions and cation. Filter stage 34 to a 0.2 micron particle size is used prior to the final resistivity check which typically is 8 Megohms. The liquid after particle removal, deionization and resistivity monitoring is introduced at the second end of the tank.

In normal operation, the processing environment wherein the removal of deposited material from the components occurs is likely to be greater than a 10,000 clean room. The final cleaning and packaging is to be done in a class 100 final clean room as designated by Federal Standard 209. Thus, the atmosphere in the processing environment at the first end of the tank is at least 100 times dirtier. The surface of the components is reflective of that difference prior to immersion and transport by the present invention. The immersion cleaning carried out concurrently with the transport of the component while immersed results in the delivery of a cleaned component having a surface cleanliness equivalent to that attained in the final clean room. Exposure of the components to a less strictly maintained atmosphere during transport has been eliminated.

The embodiment of FIG. 1 is intended for use with components of typical weight and size. In the embodiment of FIG. 6, the guideways on the side of the tank and the manually movable support are replaced by an overhead support structure utilizing a flanged beam 60 bolted to the ceiling as shown in FIG. 9. A pair of rollers 61 ride along the upper surface of the lower flange. A C-shaped bracket is used to support a covered pulley 63 having cable 64 depending therefrom which receives a hook to support the component. Cable 64 may be of fixed length or an electrically controlled pulley with motor may be used if the size of the component so requires. The operator moves the overhead support structure along the beam by applying a force to the cable although a mechanized overhead drive can be employed if desired.

The tank in the embodiment of FIGS. 6 and 7 utilizes a weir 72 in the tank 70 which is located near its first end 71. The side drain coupling 22 in the embodiment of FIG. 1 is eliminated in favor of the skimming action of the weir 72 and the introduction of the treated recirculated liquid at coupling 75 proximate to the second end of the tank. The introduction of make-up liquid in the tank can be accomplished by merely adding liquid at the top of the tank or by providing a feed inlet into the tank from a remote supply. The movement of the components through the tank provides surface activity in the liquid to enhance the effectiveness of the weir. The output from coupling 74 can be retreated by introduction into the circulation loop of FIG. 5 if desired.

In connection with the embodiment of FIG. 6, the provision of an intermediate particle barrier 77 is to be noted. The use of the first and second particle barriers 78 and 79 is consistent with the embodiment of FIG. 1. However, the placement of a curtain of vertically-overlapping plastic strips 82 as shown in FIG. 8 forms an intermediate barrier further preventing the migration of particles from the first end 71 toward the second end 72. The ports in the particle barriers 78 and 79 are provided with panels that open horizontally to provide access to the tank thereby enabling the cable to pass through the port. Each particle barrier is provided with a conformed opening 80 as shown in FIG. 9 to permit the overhead support to pass therethrough. A similar opening 81 is provided in the intermediate barrier shown in FIG. 8.

The embodiments of FIG. 1 and FIG. 6 each include the first and second spaced barriers as part of the interior walls of the facility. The spaces therebetween are bounded in a manner determined by the wall arrangement in the facility. In most applications, the second particle barrier is part of the wall structure of the bounded clean room in which the final steps including packaging are to be performed with the cleaned components. The positive pressure established therein maintains the cleanliness standard in that room as well as serving to reduce the mount of particulate matter entering through the first particle barrier.

Figure 11:
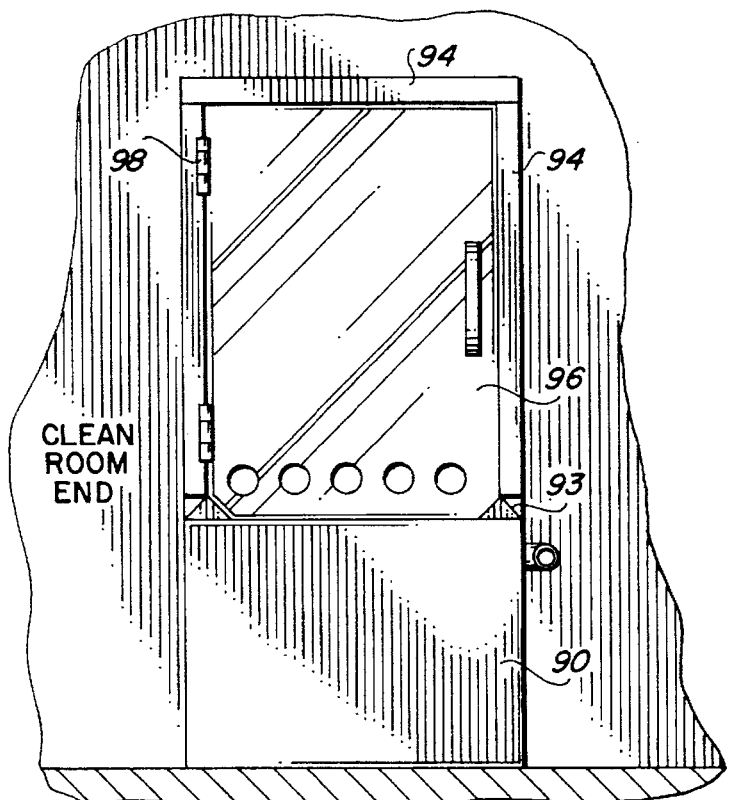
FIG. 11 is an end view of the embodiment of FIG. 10.

In applications wherein the wall structure does not conveniently permit the use of two walls, the embodiment of FIGS. 10 and 11 can be employed. As shown, the wall 95 is part of the bounded clean room. The tank 90 is provided with first and second particle barriers each having a hinged panel 96 supported for horizontal movement by hinges 98 mounted on the vertical edges of shroud 94 which covers all but that portion of tank 90 extending into the clean room. The guideways 93 conform to the bottom edge of panel 96 in the same manner as with the embodiment of FIG. 1 and the openings are provided for the flow of air from the clean room. The use of the shroud increases the utility of the present invention by providing transport of components while undergoing immersion cleaning without utilizing two structural walls.

While the above description has referred to different embodiments of the invention, it is to be noted that variations and modifications may be made therein without departing from the scope of the invention as claimed.

I claim:

1. Apparatus for the immersion cleaning of equipment components concurrently with the transport of the components from a processing environment to a bounded clean room, said apparatus comprising:
   a) a tank containing a liquid therein and supported on a base surface, said tank having first and second ends and a longitudinal axis therebetween;
   b) a transducer contained in said tank for generating ultrasonic waves in the liquid;
   c) a first particle barrier located at the first end of the tank to shield the liquid from particles in the processing environment, said first barrier containing a first port therein;

d) a first panel located in the first port and moveable between open and closed positions;

e) a second particle barrier bounding the clean room and located proximate to the second end of the tank, said second barrier containing a second port therein;

f) a second panel located in the second port and moveable between open and closed positions; and g) a movable component support overlying the tank and in alignment with the longitudinal axis thereof, said support having at least one hook depending therefrom to support a component immersed in the bath, the movement of the support from the first tank end to the second tank end transporting the component through the bath to the bounded clean room.

2. The apparatus in accordance with claim 1 further comprising an intermediate particle barrier located between the first and second ends of the tank.

3. The apparatus in accordance with claim 1 wherein said second particle barrier is spaced from the second end of the tank, said second end extending into the bounded clean room.

4. The apparatus in accordance with claim 1 further comprising a shroud connected between said first and second particle barriers, said shroud enclosing the portion of the tank between said first and second particle barriers.

5. The apparatus in accordance with claim 1 wherein said first and second panels each contain openings therein for the passage of air therethrough.

6. The apparatus in accordance with claim 1 further comprising a fluid circulation pump communicating with the first and second ends of the tank for introducing liquid at the end proximate to the clean room and introducing fluid at the opposing tank end.

7. The apparatus in accordance with claim 6 further comprising a fluid filter coupled to the fluid circulation pump for removing particles from the fluid prior to introducing the fluid into the tank.

8. The apparatus in accordance with claim 7 further comprising means for removing surface particles from the fluid in the tank.

9. The apparatus in accordance with claim 8 wherein the liquid in the tank is deionized water.

10. The apparatus in accordance with claim 9 wherein the fluid filter removes particles having a dimension greater than 0.1 micron.

11. The apparatus in accordance with claim 10 further comprising an ion exchanger coupled to the fluid circulation pump to purify the water.

12. The apparatus in accordance with claim 1 wherein said movable component support includes an overhead rail spaced above the tank and in general alignment with the longitudinal axis thereof.

13. The apparatus in accordance with claim 12 wherein said overhead rail extends into the processing environment and into the bounded clean room.

14. The apparatus in accordance with claim 13 further comprising an intermediate particle barrier located between the first and second ends of the tank.

15. The apparatus in accordance with claim 14 wherein said second particle barrier is spaced from the second end of the tank, said second end extending into the bounded clean room.

16. A method for conveying equipment components from a processing room to a clean room, said method comprising the steps of:

a) suspending the components in a fluid cleaning bath in the processing room for movement along the longitudinal axis of the bath;

b) establishing at least one particle barrier between the processing room and the clean room;

c) directing a flow of air from the clean room to the processing room along the longitudinal access of the bath;

d) transporting immersed components through the bath to the clean room; and e) removing the components from the bath in the clean room.

17. The method in accordance with claim 16 further comprising the steps of introducing ultrasonic energy into the fluid cleaning bath during movement of the components therethrough.

18. A method for conveying equipment components from a processing room to a clean room, said method comprising the steps of:

a) suspending the components in a fluid cleaning bath having first and second opposing ends and a longitudinal axis extending therebetween, said bath extending between the processing room and the clean room;

b) establishing first and second spaced particle barriers between the processing room and the clean room;

c) directing a flow of air from the clean room to the processing room along the longitudinal axis of the bath;

d) transporting immersed components through the bath to the clean room; and e) removing the components from the bath in the clean room.

* * * * *